United States Patent [19]

O'Brien

[11] Patent Number: 4,988,998

[45] Date of Patent: Jan. 29, 1991

[54] DATA COMPRESSION SYSTEM FOR SUCCESSIVELY APPLYING AT LEAST TWO DATA COMPRESSION METHODS TO AN INPUT DATA STREAM

[75] Inventor: John T. O'Brien, Louisville, Colo.

[73] Assignee: Storage Technology Corporation, Louisville, Colo.

[21] Appl. No.: 403,084

[22] Filed: Sep. 5, 1989

[51] Int. Cl.⁵ .................. H03M 7/30; H03M 7/46
[52] U.S. Cl. .................................. 341/55; 341/87; 341/106
[58] Field of Search ............... 341/51, 52, 55, 87, 341/95, 60, 63, 67, 88, 106, 107

[56] References Cited

U.S. PATENT DOCUMENTS

| | | | |
|---|---|---|---|
| 4,021,782 | 5/1977 | Hoerning | 341/51 |
| 4,558,302 | 12/1985 | Welch | 341/95 |
| 4,626,829 | 12/1986 | Hauck | 341/107 |

*Primary Examiner*—William M. Shoop, Jr.
*Assistant Examiner*—H. L. Williams

*Attorney, Agent, or Firm*—Dorr, Carson, Sloan & Peterson

[57] ABSTRACT

The improved data compression system concurrently processes both strings of repeated characters and textual substitution of input character strings. In this system, the performance of data compression techniques based on textual substitution are improved by the use of a compact representation for identifying instances in which a character in the input data stream is repeated. This is accomplished by nesting a run length encoding system in the textual substitution system. This structure adds the recognition of runs of a repeated character before the processor performs the textual substituted data compression operation. A further performance improvement is obtained by expanding the alphabet of symbols stored in the compressor's dictionary to include both the characters of the input data stream and repeat counts which indicate the repetition of a character. The handling of these repeat counts by the textual substitution based compression technique is no different than the handling of characters, or certain modifications are made in the handling of repeat counts.

21 Claims, 3 Drawing Sheets

DATA COMPRESSION SYSTEM FOR SUCCESSIVELY APPLYING AT LEAST TWO DATA COMPRESSION METHODS TO AN INPUT DATA STREAM

CROSS REFERENCE TO RELATED APPLICATIONS

This application is related to patent application Ser. No. 308,767 filed Feb. 9, 1989 for John T. O'Brien et al.

FIELD OF THE INVENTION

This invention relates to data processing systems and, in particular, to an improved data compression apparatus that efficiently reduces the size of the data file for transmission or storage on the data processing system.

PROBLEM

It is a problem in the field of data processing systems to reduce the size of the data files that are stored in memory. These data files typically contain a significant amount of redundancy in the data. There are four basic types of data redundancy. The first type of data redundancy is character distribution, wherein in a typical character string some characters are used more frequently than others. A second type of data redundancy is character repetition, wherein a string of repetitions of a single character occurs. In this case, the message can usually be encoded more compactly than by just repeating the character symbol. A third type of data redundancy is high usage patterns, wherein certain sequences of characters appear with relatively high frequency. These sequences of characters can be represented with relatively fewer bits for a net saving in both time and space. The fourth type of data redundancy is positional redundancy, wherein certain characters appear consistently at a predictable place in each block of data. These four types of data redundancy enable data compression algorithms to reduce the size of the data file for data storage purposes.

Lempel and Ziv, in numerous published papers, describe the method of compressing data in which the compressor maintains a dictionary of character sequences which have already been encountered in the input data stream. When a sequence of characters is being compressed and that sequence of characters has already been encountered and stored in the dictionary, the compressor causes a reference value (sometimes called a pointer, code word or token) to be output. The reference value identifies the string in the dictionary that is the same as the sequence of characters being compressed. Generally, the number of bits required to identify the entry in the dictionary that contains this sequence of characters is smaller than the number of bits that would have been required had the characters that make up the string been output. Thus, the data is compressed.

This process of compressing data by replacing sequences of characters with a reference value which identifies an entry in a dictionary is called textual substitution. The reconstruction of the original data by a decompressor is made possible by having the decompressor build the same dictionary of strings which the compressor built as it was compressing the data. Because modifications to the dictionary are based only on strings which have been previously encountered, the decompressor is capable of performing the same updates to the dictionary as it is decompressing the data as the compressor performed as it was compressing the data.

Many variations on this basic data compression technique have been considered and implemented. Among the components of the basic method which may be changed are: the method of initializing the dictionary; the method of matching input character sequences with strings contained in the dictionary; the method of selecting which strings of characters should be added to the dictionary and where in the dictionary they should be added; and if the dictionary is limited to a finite size, the method of choosing strings to be deleted from the dictionary.

For example, U.S. Pat. No. 4,814,746 issued Mar. 21, 1989 to V. S. Miller et al. teaches a data compression method which modifies the data compression method of Lempel and Ziv by addition of new character and new string extensions to improve the compression ratio. This method also includes a routine to delete the least recently used string to limit the encoding tables to a fixed size to thereby significantly improve data transmission efficiency.

Another data compression patent is U.S. Pat. No. 4,558,302 issued Dec. 10, 1985 to P. A. Welch that discloses a data compression method which searches the input data stream to determine the longest match of a stored string. Each stored string comprises a prefix string and an extension character where the extension character is the last character in the string and the prefix string comprises all but the extension character. When the longest match between the input data character string in the stored strings is determined, the code signal for the longest match is transmitted as the compressed code signal for the encountered string of characters and an extension string is stored in the string table. The prefix of the extended string is the longest match and the extension character of the extended string is the next input data character following the longest match.

A characteristic of all these compression techniques is that they do not handle sequences of the same character repeated several times in a row any differently than other sequences of characters even though repetitions of a single character are commonly encountered in the data stored or transmitted by a computer.

Run length limiting is a form of data compression which is widely employed to cause the representation of the repetition of a character to require fewer bits than the sequence of repeated characters originally required. It is generally accomplished by choosing a character to serve as an escape character. When a character is found to be repeated several times in the input data stream, the repeated characters are replaced with the single instance of the character followed by the escape character and a repeat count. For simplicity in implementation, the repeat count is usually expressed in a form which occupies the same amount of space as a character occupies. Because of the common occurrence of character repetitions in computer data, this run length limiting technique is effective, but it has several disadvantages.

One problem arises when the character chosen to be the escape character also occurs as data in the input data stream. If the escape character is placed in the output data stream unmodified, the decompression of the data fails to reproduce the original data because the escape character is interpreted as indicating that the character following it is a repeat count. Many solutions to this problem exist, though they usually require producing a two character sequence in the output data stream whenever the escape character appears in the input data stream. Therefore, if the input data stream contains many instances of the escape character, the output data stream may actually occupy more space than the input data stream. Another problem with traditional run length limited data compression techniques is that the specification of the character, its repeat count and the escape character usually requires the same space that three characters require. Thus, compression of the data only occurs if the runs consist of four or more characters.

While run length limited data compression is useful and easy to implement, it does not yield compressed data streams which are as small as those yielded by other data compression techniques. Generally, these other techniques perform a mapping of all the input characters into output symbols. This reduces the size of the output data stream and also provides the opportunity to define additional output symbols to serve the purpose of the escape character of the run length limiting data compression technique. This eliminates the problems which arise when the escape character appears in the input data stream. Furthermore, these data compression techniques commonly use output symbols which vary in size. This means that provisions for handling varying width symbols have also been incorporated into these compression techniques and it is practical to consider using repeat counts which vary in width according to the value of the repeat count. An effective technique for identifying the width of a repeat count in the output data stream is to use a separate escape code output symbol for each possible width of a repeat count.

The problem with these aforementioned methods of data compression is that each one is directed to a particular aspect of data compression and they do not very efficiently handle both run length encoding and textual substitution.

SOLUTION

The above described problems are solved and a technical advance achieved field by the improved data compression system for concurrently processing both textual substitution and strings of repeated characters. In this system, the performance of data compression techniques based on textual substitution are improved by the use of a compact representation for identifying instances in which a character in the input data stream is repeated. A further performance improvement is obtained by expanding the alphabet of symbols stored in the compressor's dictionary to include both the characters of the input data stream and repeat counts which indicate the repetition of a character. The handling of these repeat counts by the textual substitution based compression technique may be no different than the handling of characters, or certain modifications can be made in the handling of repeat counts. Therefore, data compression effectiveness is improved not only by using a compact representation for sequences of repeated characters, but also by storing character sequences which include repeated characters in the dictionary so that the entire sequence is encoded in a single reference value.

Textual substitution data compression techniques lead to the definition of strings in the dictionary which contain sequences of repeated characters. However, the strings in the dictionary are built a character at a time or a string at a time, and many instances of a long sequence of repeated characters would have to be encountered before a string is defined which allows the entire sequence to be encoded in a single reference value. The compression efficiency of this textual substitution system is improved by nesting a run length encoding system in the textual substitution system. This structure adds the recognition of runs of a repeated character before the data compression system performs the textual substitution data compression operation. The dictionary in this system is capable of storing strings made up of a combination of repeat counts and characters from the input data stream. In the implementation of the dictionary, the number of bits available to store each element of the string must be greater than the number of bits which are required to store only characters. Thus, simply changing the basic textual substitution algorithm by increasing the size of the alphabet of input characters to include repeat counts yields improved compression effectiveness.

DETAILED DESCRIPTION

The improved data compression system more efficiently processes strings of repeated characters than previous data compression methods. In this system, the performance of data compression technique based on textual substitution are improved by the use of a compact representation for identifying instances in which a character in the input data stream is repeated. This is accomplished by nesting a run length encoding system in the textual substitution system. This structure adds the recognition of runs of a repeated character before the data compression system performs the textual substitution data compression operation.

A further performance improvement is obtained by expanding the alphabet over symbols stored in the compressors dictionary to include both the characters of the input data stream and repeat counts which indicate the repetition of a character. The handling of these repeat counts by the textural substitution based compression technique may be no different than the handling of characters, or certain modifications can be made in the handling of repeat counts. Therefore, data compression effectiveness is improved not only by using a compact representation for sequences of repeated characters, but also by storing character sequences which include repeated characters in the dictionary so that the entire sequence is encoded in a single reference value.

Textual substitution data compression techniques lead to the definition of strings in the dictionary which contain sequences of repeated characters. However, the strings in the dictionary are built a character at a time or a string at a time, and many instances of a long sequence of repeated characters would have to be encountered before a string is defined which allows the entire sequence to be encoded in a single reference value. The compression efficiency of this textual substitution system is improved by adding the recognition of runs of a repeated character before the data compression system performs the textual substitution data compression operation. This requires that the dictionary be capable of storing strings made up of a combination of repeat counts and characters from the input data stream. In the implementation of the dictionary, this requires that the number of bits available to store each element of the string must be greater than the number of bits which are required to store only characters. Thus, simply changing the basic textual substitution algorithm by increasing the size of the alphabet of input characters to include repeat counts yields improved compression effectiveness.

Basic Textual substitution Data Compression

Figure 3:
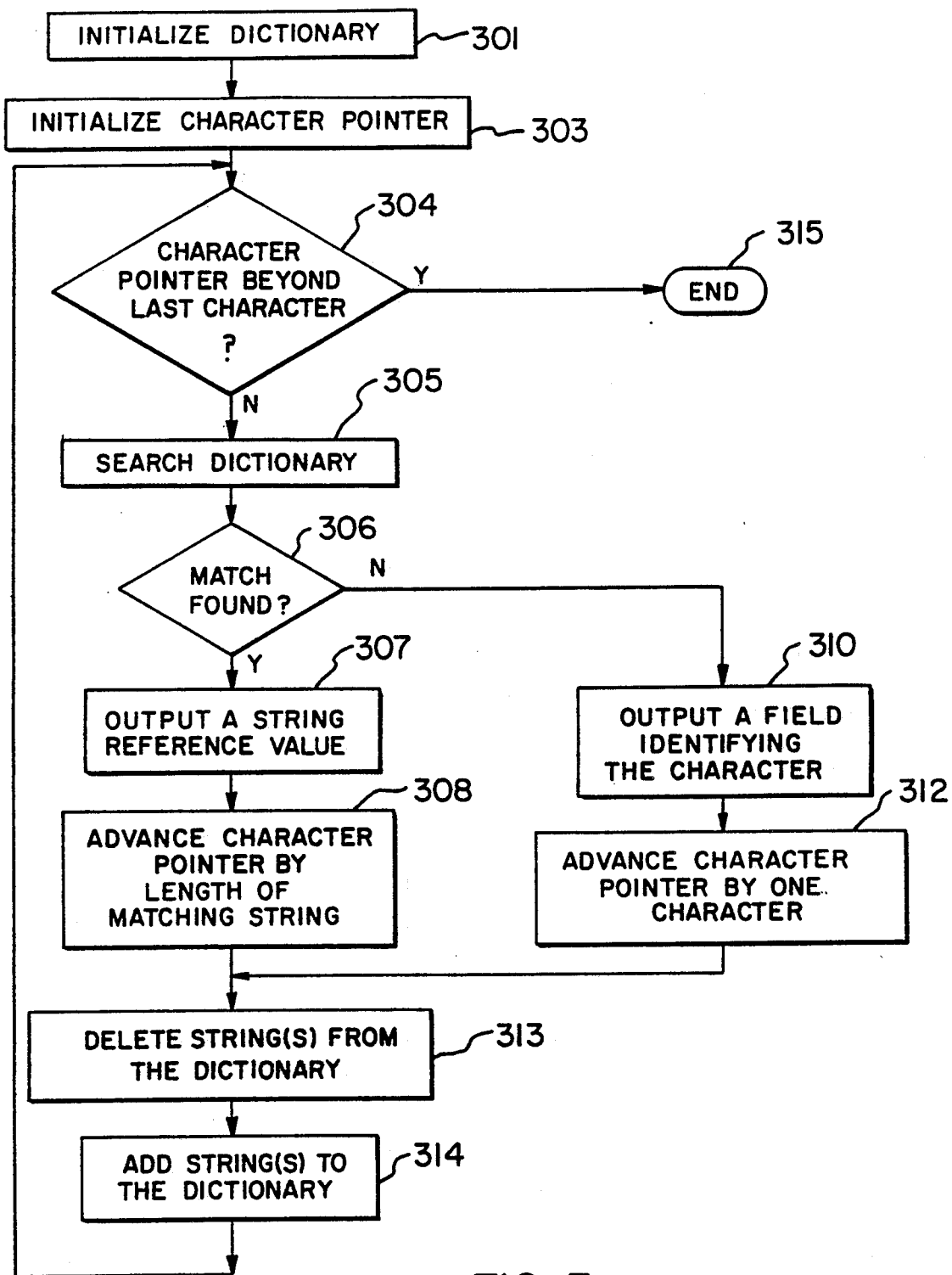
FIGS. 3 and 4 illustrate in, flow diagram form, the operational steps taken by a typical data compression system and by the improved data compression system to compress data, respectively.

The method of operation of a typical data compression system is illustrated in FIG. 3. At step 301, the dictionary of strings is initialized. The details of this initialization process are a function of the particular data compression algorithm that is selected. The dictionary can be initialized to be empty or may contain some or all of the possible single character strings or may even contain multiple character strings which are expected to be encountered in the input data stream of uncompressed characters. Once the dictionary is initialized, a character pointer is initialized at step 303 to point to the first character in the input data stream to be compressed.

The data compression process is implemented by the loop consisting of steps 304-314 which operates until no uncompressed characters remain in the input data stream. At step 304, a determination is made whether any more characters remain to be compressed. If no characters remain, the data compression process exits at step 315. If the character pointer is not beyond the last character to be compressed, processing advances to step 305. The string dictionary is searched at step 305 to find a string which matches the uncompressed characters in the input data stream, starting at the position identified by the character pointer. The result of this search is tested at step 306. If a string was found in the string dictionary which matches one or more of the uncompressed characters in the input data stream, a string reference value is output at step 307 to identify the matching dictionary string. The character pointer is then advanced at step 308 by the number of characters contained in the matching string.

If, at step 306, no matching string was found in the string dictionary, then a field is output at step 310 to identify the character presently pointed to by the character pointer. The character pointer is then advanced at step 312 by one character.

The additional steps 313, 314 are shown to illustrate the step of deleting (313) one or more strings from the string dictionary and then to possibly add (314) one or more strings to the string dictionary. There are many different techniques proposed to implement these steps and the specific technique used is not relevant to this discussion. Therefore, these steps are simply mentioned for consistency with existing systems. Once step 314 is executed, processing returns to step 304 to test for additional uncompressed characters in the input data stream.

Improved Data Compression System Architecture

Figure 1:
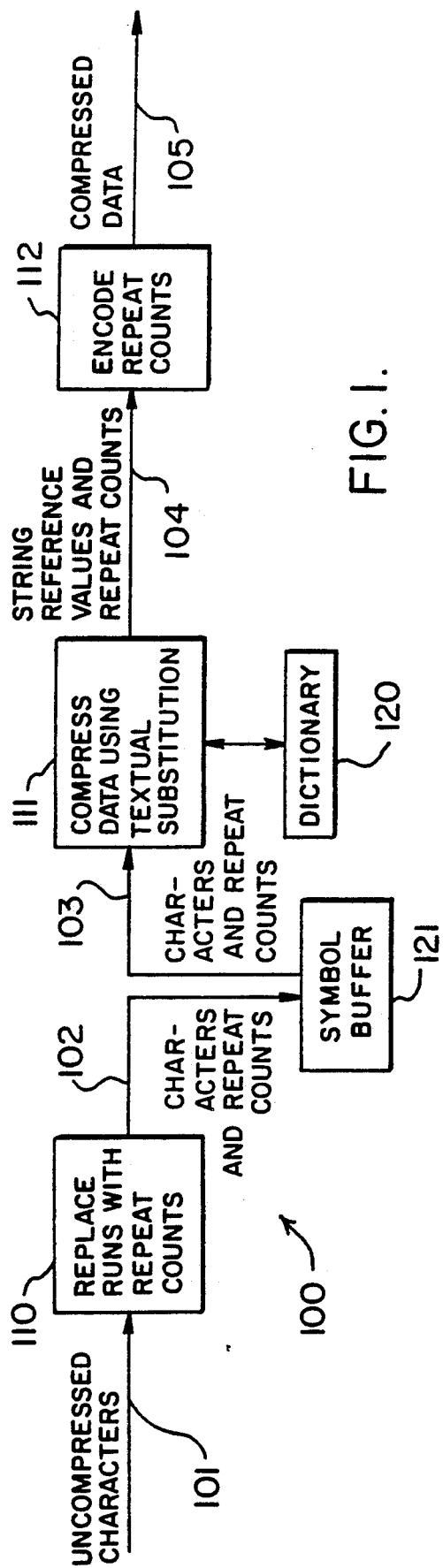
FIGS. 1 and 2 illustrate in, block diagram form, the of architecture the present improved data compression system.

FIG. 1 depicts the architecture improved data compression system 100 in which repetitions of uncompressed characters are encoded more efficiently and Appendix A attached hereto discloses a program to implement the steps of the data compression and decompression processes. The data compression system 100 is represented as consisting of three subprocesses (110, 111 and 112) which communicate through flows of data (102, 103 and 104). These processes may be implemented in hardware, software or a combination of both.

The Replace Runs With Repeat Counts process 110 examines the input data stream that consists of uncompressed characters 101 and produces a stream of characters and repeat counts 102. Repeat counts are produced whenever there are three or more repetitions of a single uncompressed character. In the data produced by the Replace Runs With Repeat Counts process 110, these runs of a single character in the input character stream are replaced with the character followed by a repeat count. The storing of the characters and repeat counts 102 in symbol buffer 121 is not required, but has been done to allow the description of the Compress Data Using Textual Substitution process 111 to be simplified. It should be understood that the choice may be made in implementing the improved data compression system to have the Compress Data Using Textual Substitution process 111 immediately process characters and repeat counts 102 without the information first being first stored in symbol in symbol buffer 121.

The Compress Data Using Textual Substitution process 111 examines the stream of input characters and repeat counts 103 which were previously stored in symbol buffer 121, and replaces sequences of input characters and repeat counts which have been previously encountered and stored in the dictionary 120 with string reference values. It also adds to the dictionary 120 (and possibly deletes from the dictionary 120) strings which consist of previously encountered sequences of input characters and repeat counts. If the Compress Data Using Textual Substitution process 111 encounters a repeat count in input data stream 103, it is encoded with a string reference value if a matching string which contains the repeat count is found in the dictionary 120. If no matching string which contains the repeat count is found, the repeat count is output rather than a string reference value representing a string containing the repeat count which are stored in symbol buffer 121.

The Encode Repeat Counts process 112 produces a compressed data stream 105 from a stream of string reference values and repeat counts 104. As described above, this can be done by replacing each repeat count with a reserved reference value followed by an encoded form of the repeat count. This allows the data decompression process to distinguish repeat counts from string reference values.

Data Decompression System

Figure 2:
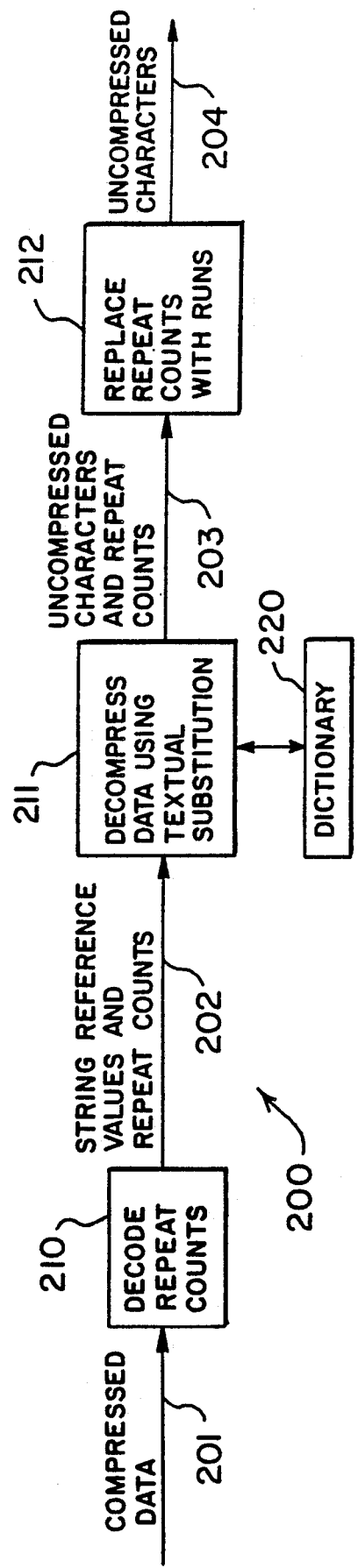

FIG. 2 shows data decompression system 200 which decompresses the data compressed by the data compression process 100 in FIG. 1. The Decode Repeat Counts process 210 translates instances of reserved reference values followed by repeat counts in the compressed data 201 into repeat counts. Its output 202 then consists of string reference values and repeat counts.

The Decompress Data Using Textual Substitution process 211 replaces the string reference values in the stream of string reference values and repeat counts 202 with a sequence of characters and repeat counts. The repeat counts in this process's input data stream 202 are not replaced by this process. The dictionary 220 contains the sequence of characters and repeat counts encoded by each of the string reference values. The Decompress Data Using Textual Substitution process 211 also adds to the dictionary 220 (and possibly deletes from the dictionary 220) strings which consist of previously encountered sequences of characters and repeat counts. The same strings are added to the dictionary 220 or deleted from the dictionary 220 that were added or deleted by the Compress Data Using Textual Substitution process 111.

The Replace Repeat Counts With Runs process 212 replaces repeat counts in its input data stream 203 with a number of copies of the character most recently output by this process. The number of repetitions is specified by the repeat count.

The data decompression process 200 reverses each of the modifications performed on the input characters 101 received by the data compression process 100. Thus, the characters 204 produced by the data decompression process 200 are the same as those presented as input characters to the data compression process 100.

Improved Textual Substitution Data Compression

Figure 4:
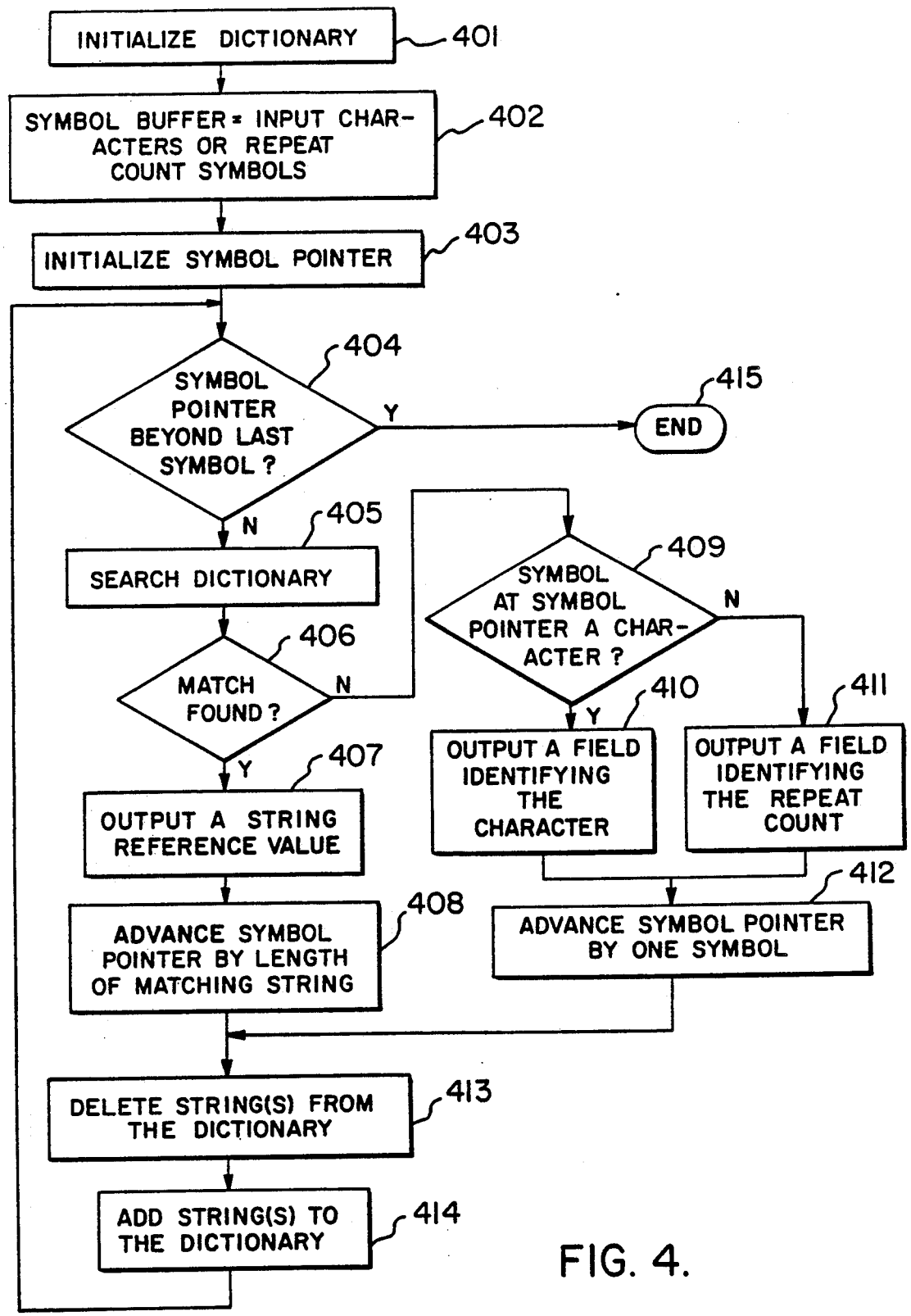

The method of operation of the present improved data compression system 100 is illustrated in FIG. 4. At step 401, the string dictionary 120 is initialized. Again, the details of this initialization process are a function of the particular data compression algorithm that is selected. The string dictionary 120 can be initialized to be empty or may contain some or all of the possible single symbol strings or may even contain multiple symbol strings which are expected to be encountered in the input data stream 103 of symbols. Once the string dictionary 120 is initialized, Replace Runs With Repeat Counts process 110 at step 402 loads a symbol buffer 121 with symbols, representing uncompressed characters and repeat counts. Rather than compressing characters, the ensuring steps perform textual substitution data compression of these symbols. Process 110 replaces instances of three or more repetitions of the same character by one symbol which is the character followed by another symbol which is a repeat count indicating how many times the character was repeated. Once the symbol buffer 121 is loaded, a symbol pointer is initialized at step 403 to point to the first symbol in the symbol buffer 121 to be compressed.

The data compression process is implemented by the loop consisting of steps 404-414 which operates until no symbols remain in symbol buffer 121. At step 404, a determination is made whether any more symbols remain to be compressed. If no symbols remain, the data compression process 100 exits at step 315. If the symbol pointer is not beyond the last symbol in symbol buffer 121, processing advances to step 405. The string dictionary 120 is searched at step 405 to find a string which matches the symbols in the symbol buffer 121, starting at the position identified by the symbol pointer. The result of this search is tested at step 406. If a string was found in the string dictionary 120 which matches one or more of the symbols in symbol buffer 121, a string reference value is output at step 407 to identify the matching dictionary string. The symbol pointer is then advanced at step 408 by the number of symbols contained in the matching string.

If, at step 406, no matching string was found in string dictionary 120, then at step 409 the symbol pointed to by the symbol pointer is examined to determine whether it is a character or a repeat count. If the symbol is a character, then a field is output at step 410 which identifies the character. If, at step 409, the symbol is determined to be a repeat count, then a field is output at step 411 which identifies the repeat count. The symbol pointer is then advanced at step 412 by one symbol.

The additional steps 413, 414 are shown to illustrate the step of deleting (413) one or more strings from the string dictionary 120 and then to possibly add (414) one or more strings to the string dictionary 120. There are many different techniques proposed to implement these steps and the specific technique used is not relevant to this discussion. Once step 414 is executed, processing returns to step 404 to test for additional symbols in symbol buffer 121.

It is obvious that step 402 may or may not be included in the data compression loop (steps 404-414) simply as a matter of design choice. The symbol buffer 121 can operate prior to or concurrently with the textual substitution process 111. Additionally, symbol buffer 121 can operate on all or only a segment of the input data stream.

The method of operation of the decompression process is not illustrated in detail herein. This decompression method is the reverse of the compression method and is obvious to one skilled in the art in view of the above description of the improved data compression method.

Modifications to the Basic Textual Substitution Algorithm

Compression effectiveness can sometimes be improved by avoiding the definition of strings which start with a repeat count. This produces increased data compression efficiency if the characteristics of the data being compressed are such that strings which start with a repeat count would rarely be referenced. When definition of a string which starts with a repeat count is suppressed and the algorithm used for defining new strings adds the first character of the next string onto the end of the previous string, a further modification to the textual substitution algorithm can be made. Rather than defining a string consisting of a repeat count followed by the next input character, a string can be defined consisting of the entire previously defined string (which ends in a repeat count) followed by the next input character.

Take, for example, the sequence of input characters AAAB, with the dictionary 120 only containing entries for the input characters A and B. Replace Runs With Repeat Counts process 110 represents this sequence as A, Repeat 2, B before textual substitution takes place. Because A, Repeat 2 does not exist in the dictionary 120, a string consisting of A, Repeat 2 is added to the dictionary 120. An unmodified textual substitution algorithm would then search for Repeat 2, B and, because that string is not in the dictionary 120, the string Repeat 2, B would be added to the dictionary 120. However, if definition of strings which start with a repeat count is suppressed, there is no point in searching for a string consisting of Repeat 2, B. In addition, the Repeat 2, B string should not be added to the dictionary 120. Instead, a search for the string A, Repeat 2, B could be performed and, because the string has not yet been defined, the string A, Repeat 2, B is added to the dictionary 120.

In this example, the search for the string A, Repeat 2, B fails because the string A, Repeat 2 was just added to the dictionary 120 and no string which starts with A, Repeat 2 could possibly have been previously defined. Clearly, the search for the string A, Repeat 2, B could have been skipped. However, it is generally simpler to implement the data compression algorithm by always performing a search for a string before defining it.

Handling Long Runs

There are two ways of handling runs which are longer than can be represented by an input character followed by the maximum repeat count. One way of encoding a run of this length is to produce the sequence: Char, Max Repeat Count, Char, Max Repeat Count, . . . The other way is to produce the sequence: Char, Max Repeat Count, Max Repeat Count, . . . The second approach produces fewer entities to be encoded by the textual substitution algorithm. For many textual substitution algorithms, this yields greater compression effectiveness. However, if the textual substitution algorithm has been modified as just described, the first approach allows a long run to be compressed into fewer bits than if the second approach were used.

If this modified textual substitution algorithm were used to compress the sequence Char, Max Repeat Count, Max Repeat Count, . . . then each time a new repeat count was received, a search would be performed for the string just defined followed by the new repeat count. As described before, this search always fails, so the representation of the maximum repeat count is output and the process repeated. The compressed output would then consist of the sequence: Reference Value of Char, Encoded Max Repeat Count, Encoded Max Repeat Count, . . . Even though strings are being defined in the dictionary, no reference to previously defined strings takes place because there are no strings in the dictionary which start with a repeat count and each entity being processed is a repeat count.

The sequence Char, Max Repeat Count, Char, Max Repeat Count, . . . provides the modified textual substitution algorithm the opportunity to reference the strings which were just defined. The first few instances of Char, Max Repeat Count lead to the definition of strings containing repetitions of Char, Max Repeat Count. As subsequent instances of Char, Max Repeat Count are encountered, matching strings are found in the dictionary and reference values are output which encode several repetitions of Char, Max Repeat Count. Thus, the size of the compressed representation of the run is reduced.

Implementation of the Improved Data Compression System

The following program listings, set forth in the C language, embody the steps of the present invention when used with a simple form of a textual substitution data compression algorithm. This program can be run on any computer which uses 8 bit bytes and a binary representation of data and which is equipped with a compatible C compiler.

The compression 100 and decompression 200 processes are each implemented as functions to be called in a main program that would manage the input and output data. The compress and decompress functions each refer to constant values defined in the common header file "compress.h". The contents of this header file are shown in the first portion of the following program listing.

The compression 100 and decompression 200 processes must output or input data fields which vary in width. The functions Pack() and UnPack() perform the storing or retrieving of these variable width fields. Many techniques are suitable for packing bit fields into computer memory words and unpacking bit fields from computer memory words and these techniques are well known in the data processing art.

Whenever input characters and repeat counts are stored or transmitted together, it is necessary to be able to distinguish input characters from repeat counts. In these programs, such a distinction is made by storing input characters as positive values and storing repeat counts as negative values. This allows the computer executing the programs to rapidly distinguish between input characters and repeat counts when necessary. In the compress function, the array rll—buffer[] contains data stored in this fashion. This array corresponds to symbol buffer 121 in FIG. 1. In the decompress function, the array stack[] (which is accessed through the push() and pop() macros) also contains data stored in this fashion. This array corresponds to flow 203 in FIG. 2. In a hardware implementation of these processes, characters and repeat counts could both be stored as positive (or unsigned) values and a flag bit used to distinguish a repeat count from a character.

Appendix A

```
/******************************************************************/
/*   FILE: compress.h                                              */
/******************************************************************/

/* BYTE_SIZE is the width, in bits, of the characters in the input and
     * output data streams.
     */
#define BYTE_SIZE 8
    /* CHUNK_SIZE is the length of the largest chunk of data that can be
     * compressed before reinitializing the dictionary.
     */
#define CHUNK_SIZE 2048
    /* LOG2_CHUNK_SIZE is the value of (logarithm base 2 of CHUNK_SIZE )
     * rounded up to the next integer.  Stated another way, it is the number
     * of bits needed for the binary representation of the value (CHUNK_SIZE - 1).
     */
#define LOG2_CHUNK_SIZE 11
    /* Define the longest run which will be replaced by a character followed
     * a repeat count of LONGEST_RUN - 1.
     */
```

```c
#define LONGEST_RUN 256
    /* LOG2_LONGEST_RUN is the value of (logarithm base 2 of LONGEST_RUN )
     * rounded up to the next integer. Stated another way, it is the number of
     * bits needed for the binary representation of the value LONGEST_RUN - 1.
     */
#define LOG2_LONGEST_RUN 8
    /* REPEAT_COUNT_REFS is the number of reference values reserved
     * for run length specifiers.
     */
#define REPEAT_COUNT_REFS ( LOG2_LONGEST_RUN - 1 )
    /* Define the reference value which is reserved for indicating the
     * end of a chunk of data.
     */
#define END_OF_DATA_REF_VAL 0
    /* One reference value is reserved to flag the end of a chunk.
     */
#define SPECIAL_REFS 1

/*******************************************************************/
/*   FILE: compress.c                                              */
/*******************************************************************/
#include "compress.h"
/* function defined within this source file */
int compress();
/* Define compile time flags used in this file: */
    /* DICTIONARY_SIZE determines the size of the dictionary which stores
     * strings. Its value is the first power of 2 which is larger than
     * (CHUNK_SIZE * 2). This guarantees that the dictionary will never be
     * more than one half full so there won't be too many hash collisions
     * when searching the dictionary.
     */
#define DICTIONARY_SIZE ( (1<<LOG2_CHUNK_SIZE) * 2 )
    /* HASH_MASK is used to mask the array index which is used when
     * accessing the dictionary. The use of this index guarantees that
     * the resultant array index can never exceed the bounds of the array.
     */
#define HASH_MASK (DICTIONARY_SIZE - 1)
    /* HASH_SHIFT is used to shift a character value so that it is left
     * justified within the bit field which is used as the array index into
     * the dictionary.
     /* BYTE_SIZE+1 leaves a bit on the left which is zero for a character
     * and one for a repeat count.
     */
#define HASH_SHIFT ( (LOG2_CHUNK_SIZE + 1) - (BYTE_SIZE + 1) )
    /* UNMATCHABLE_SYMBOL (-1) is a value which cannot occur in the input
     * stream, even after runs have been replaced with repeat counts.
     * (-1 would signify a repeat count of 1, which will never be produced
     * by the process which replaces runs with repeat counts.)
     * This value is used during the last pass through the compression loop
     * to force the search for a string in the dictionary to fail so that
     * the final reference value will be output.
     */
#define UNMATCHABLE_SYMBOL -1
#define FALSE 0
#define TRUE 1

/********************* START OF PROLOGUE *************************
* MODULE TITLE:   Compress a Chunk of Data
* MODULE NAME:    compress
* STATIC FUNCTION DEFINED IN THIS MODULE:
*/
static int Length();
/*
* FUNCTIONAL DESCRIPTION:
* This module takes a chunk of input data and reduces the size of the
* block through an implementation of a textual substitution compression
* algorithm.
* Features of the implementation include:
*       1. Run length compression with repeat codes being stored in the
*          dictionary along with characters.
*       2. Single character strings do not occupy space in the
*          string dictionary.
*
```

```
* The basic textual substitution algorithm is based on one described
* in the article: "A Technique for High-Performance Data Compression"
* by Terry A. Welch, Computer, June 1984, pp 8-19.
*
* OPERATIONAL DESCRIPTION:
*   Replace each run of a character with the character followed by a
*     repeat count
*   Add beyond the last symbol of the input stream a symbol which will not
*     have ever been encountered before and will therefore cause the final
*     pass through the loop to output the final reference value
*   Initialize the dictionary
*   Set initial width of reference values
*   Matched_String = the reference value for the first input character
*   Remember that the string referenced by Matched_String has not yet
*     been output
*   DO WHILE more input symbols to process
*       Input_Symbol = next symbol from the input data
*       Search dictionary for the string consisting of Matched_string
*         followed by Input_Symbol
*       If the string was found in the dictionary
*           Matched_String = the reference value for this longer string
*       Else (* the string wasn't found in the dictionary *)
*           If the string referenced by Matched_String hasn't yet been output
*               Output the reference value stored in Matched_String
*           Place in the dictionary a new string consisting of
*             Matched_String followed by Input_Symbol
*           If Input_Symbol is a repeat count
*               Output the encoded form of the repeat count
*               Matched_String = the reference value of the string just
*                 added to the dictionary
*               Remember that the string referenced by Matched_String has
*                 already been output
*           Else (* Input_Symbol is a characer *)
*               Matched_String = the reference value for Input_Symbol
*               Remember that the string referenced by Matched_String has
*                 not yet been output
*           EndIf (* Input_Symbol is a repeat count *)
*       EndIf (* the string was found in the dictionary *)
*   EndDo
*   If the length of the data being compressed is less than the
*     maximum length of a chunk
*       Output the End Of Data reference value
*   If the output data does not end on a byte boundary
*       Pad the output data to the next byte boundary
*   RETURN: Output buffer containing compressed data,
*           Length of the data in the output buffer
*
* MODULES CALLED:
/* extern void InitPack( unsigned char *output_buffer_ptr ) */
   extern void InitPack();
/* extern void Pack( int field_width, unsigned int data_bits_to_output ) */
   extern void Pack();
   extern void PadToNextByte();
   extern unsigned int PackedLength(); /* returns number of bits which have */
                                       /* been packed into the output buffer */
/*
*
* INPUT PARAMETERS:
*   unsigned char input_buffer[]   (* data to be compressed *)
*   int           input_length     (* number of bytes of data in input_buffer *)
*                                  (*   this value must be <= CHUNK_SIZE *)
*   unsigned char output_buffer[]  (* buffer into which the compressed *)
*                                  (*   data is written *)
*
* RETURN VALUE:
*   int (* return code *)          (* number of bytes of compressed data *)
*                                  (*   stored in output_buffer *)
*
************************  END OF PROLOGUE  ************************
*/
```

```
int
compress( input_buffer, input_length, output_buffer )
    unsigned char input_buffer[], output_buffer[];
    int input_length;
±
    char matched_string_has_already_been_output;  /* boolean */ register int loop_count;    /* multi-purpose loop counter */ int next_ref;   /* reference value to be assigned to the next */
                    /* string added to the dictionary */ int
            ref_width,   /* number of bits to be used when a reference */
                         /*    value is output */
            ref_limit,   /* when next_ref exceeds this value, ref_width */
                         /*    must be incremented */
            matched_string, /* reference value of the string in the */
                            /*    dictionary which most recently matched */
                            /*    the input data */
            input_symbol;   /* the symbol (character or repeat count) */
                            /*    most recently input */
/* rll_buffer stores symbols which may be either characters (positive
 * values) or repeat counts (negative values).
 * One extra location is needed to store UNMATCHABLE_SYMBOL at the end
 * of the data being compressed.
 */
static int  rll_buffer[CHUNK_SIZE+1];
int         *bp,        /* pointer to a symbol in rll_buffer */
            rll_count;  /* number of symbols in rll_buffer */
/* The variables search_string and compare_string as well as the
 * string field of the dictionary_entry structure each contain a
 * string definition. The definition contains the reference value
 * of the string which contains all the symbols of the string being
 * defined except for the last symbol of the string. This string
 * is called the prefix string, and its reference value is stored in
 * the left half of the long value. The right half of the long
 * value contains the symbol which is the last symbol of the string.
 */
long compare_string,/* when performing a dictionary search, this */
                    /*    holds the string definition of the string */
                    /*    being searched for */
     search_string; /* and this holds the string definition of the */
                    /*    string stored in the dictionary entry */
                    /*    presently being examined */
/* define the structure of each dictionary entry */
struct dictionary_entry
±   long string;    /* definition of the string contained in this */
                    /*    dictionary entry */
    int  ref_value; /* reference value of the string defined in this */
                    /*    dictionary entry */
²;
/* allocate storage for the dictionary */
static struct dictionary_entry
    dictionary[ DICTIONARY_SIZE ];
struct dictionary_entry
    *dictionary_ptr;/* pointer to the currently selected dictionary entry */
InitPack( output_buffer );  /* initialize the output buffer */

/******************************************************************/
/******************************************************************/
/*  BEGIN Replace Runs with Repeat Counts process.                */
/******************************************************************/
/******************************************************************/
    /* Replace runs of characters with the character followed by */
    /* a repeat count, which is stored as a negative number. */
    rll_buffer[0] = input_buffer[0];
    rll_count = 1;
    if ( input_length > 1 )
    ±   register unsigned char *inp = &input_buffer[0];
        register int *outp = &rll_buffer[0];
        register int repeat_count = 0;
        register unsigned char prev_c = input_buffer[0];
```

```
    loop_count = input_length - 1;
    do
±       if ( (*++inp == prev_c) && (repeat_count > -(LONGEST_RUN-1)) )
±           /* Got a repeated character.  Because repeat counts are
             * represented with negative numbers, "increment" the
             * repeat count by subtracting one.
             */
            repeat_count -= 1;
        ²else /* not a repeated character or exceeded max run length */
±           if (repeat_count != 0)
±               if (repeat_count < -1)
±                   /* The character was repeated 3 or more times. */
                    /* Save a repeat count. */
                    *++outp = repeat_count;
                ²else
±                   /* The character was only repeated twice. */
                    /* Just store the character again. */
                    *++outp = prev_c;
                ²
                repeat_count = 0;
            *++outp =       /* store this character */
            prev_c = *inp;  /* and save it to check for a run */
        ²
    ²  while (--loop_count != 0);
    /* All done with the input data.  If we were in the middle of
     * counting the length of a run when the end of the chunk was
     * reached, output the repeat count, or in the case of a run of two
     * characters at the end of the chunk, output the two characters.
     */
    if (repeat_count != 0)
±       if (repeat_count < -1)
±           /* The last character was repeated 3 or more times. */
            /* Save a repeat count. */
            *++outp = repeat_count;
        ²else
±           /* The last character was only repeated twice. */
            /* Just store the character again. */
            *++outp = prev_c;
        ²
    ²
    /* Put a symbol at the end of the data which will force the string
     * search in the last pass of the compression loop to fail so that
     * the final reference value will be output.
     * Note that this symbol doesn't contribute to the count in rll_count.
     */
    *++outp = UNMATCHABLE_SYMBOL;
    rll_count = outp - &rll_buffer[0];
² /* endif more than one input character */

/**********************************************************************/
/**********************************************************************/
/*  END Replace Runs with Repeat Counts process.                      */
/**********************************************************************/
/**********************************************************************/

/**********************************************************************/
/**********************************************************************/
/*  BEGIN Compress Data using Textual Substitution process.           */
/**********************************************************************/
/**********************************************************************/
    /* Initialize the string dictionary by filling each string entry with 0. */
±       dictionary_ptr = &dictionary[0] - 1;
        loop_count = DICTIONARY_SIZE;
        do
±           (++dictionary_ptr)->string = 0;
        ²while ( --loop_count != 0 );
    ²

/* Set next_ref to the value to be assigned to the first string */
    /* which will be added to the dictionary. */
    next_ref = (1 << BYTE_SIZE)-+ REPEAT_COUNT_REFS + SPECIAL_REFS;

/* Set ref_width to the number of bits needed to allow any reference
```

```
 * value from 0 through next_ref - 1 to be uniquely identified.
 * Set ref_limit to the largest value that next_ref can contain
 * while still being able to represent all possible reference values
 * in ref_width bits.
 */
ref_width = Length( next_ref - 1 );
ref_limit = 1 << ref_width;

/* Initialize matched_string to the reference value of the first
 * character in the chunk so that first pass will look up a string
 * consisting of the first character followed by the second character.
 * This search will fail, so the reference value of the first
 * character will be output and a string consisting of the first
 * characer followed by the second character will be defined.
 */
matched_string = rll_buffer[0] + REPEAT_COUNT_REFS + SPECIAL_REFS;
bp = &rll_buffer[1];
matched_string_has_already_been_output = FALSE;

/* Start of Compression Loop */

/* Decrement loop_count by one so that the last loop will be done with */
/* loop_count equal to zero. */
loop_count = rll_count - 1;
do  /* loop until no more symbols to compress */
±
    /* Get the next input symbol. */
    input_symbol = *bp++;
    /* Search the dictionary for the string consisting of the string
     * whose reference value is in matched_string followed by the
     * character or repeat count in c.
     * The first dictionary entry to be tested for a match is selected by
     * hashing the combination of the values of matched_string and c.
     * If this entry contains a valid string, but it doesn't match,
     * successive entries are searched until a match is found or an
     * invalid entry is found.
     * If an invalid entry is found, it means that the string does not
     * exist in the dictionary.
     */
    dictionary_ptr = &dictionary[ ( (input_symbol << HASH_SHIFT)
                                    ¼ matched_string )
                                  & HASH_MASK ];
    compare_string = dictionary_ptr->string; /* 1st string to compare to */
    search_string = ((unsigned long)matched_string << 16) + input_symbol;
    while ( (compare_string != search_string) && (compare_string != 0) )
    ±  if ( ++dictionary_ptr == &dictionary[ DICTIONARY_SIZE ] )
       ±  /* end of dictionary, wrap around to start */
          dictionary_ptr = &dictionary[0];
       ž compare_string = dictionary_ptr->string;
    ž if ( compare_string != 0 )
    ±  /* Found a matching string in the dictionary.
        * Remember the reference value of this string so we can
        * search for an even longer string next time.
        */
       matched_string = dictionary_ptr->ref_value;
    ž else  /* this string hasn't yet been defined */
    ±
       if ( matched_string_has_already_been_output == FALSE )
       ±
          Pack( ref_width, matched_string );
       ž

/* Define a new string and assign it the next unused */
       /* reference value. */
       dictionary_ptr->string = search_string;
       dictionary_ptr->ref_value = next_ref;
       /* A new string has been defined. Bump next_ref. */
       if ( ++next_ref > ref_limit )
       ±  /* There are so many reference values defined that one more
           * bit must be used when outputting a reference value in
           * order to be able to distinguish all the possible values.
           */
```

```
                ref_width += 1;
                /* multiply ref_limit by 2 to get next width transition point */
                ref_limit <<= 1;

if ( input_symbol < 0 && input_symbol != UNMATCHABLE_SYMBOL )
            {
                int input_symbol_len;
                /* This symbol is a repeat count. */
                /* Output a repeat specifier and then set matched_string */
                /* to the reference value of this newly defined string so */
                /* that the next character or string will build a new */
                /* string which consists of this string followed by */
                /* a character or repeat specifier. */
/**************************************************************************/
/**************************************************************************/
/*  BEGIN Encode Repeat Counts process.                                   */
/**************************************************************************/
/**************************************************************************/
                /* Make the repeat count positive */
                input_symbol = -input_symbol;
                /* Output a code which identifies the length of the repeat
                 * count to follow.  Note that the leftmost bit of the
                 * repeat count is known to be a 1, so it is not output.
                 */
                input_symbol_len = Length( input_symbol ) - 1;
                Pack( ref_width, input_symbol_len );
                /* Output the repeat count */
                Pack( input_symbol_len, input_symbol - (1<<input_symbol_len) );
/**************************************************************************/
/**************************************************************************/
/*  END Encode Repeat Counts process.                                     */
/*  RESUME Compress Data using Textual Substitution process.              */
/**************************************************************************/
/**************************************************************************/
                /* A string can't begin with a repeat count, so keep
                 * building onto the string we just defined.
                 * However, remember that we have just output a repeat
                 * count, so the value in matched_string does not have
                 * to be output.
                 */
                matched_string = next_ref - 1;
                matched_string_has_already_been_output = TRUE;
            }
            else /* normal character */
            {
                /* Next time through, search for the string consisting of
                 * this character followed by the next character received.
                 */
                /* Convert input_symbol into a reference value before */
                /* storing it in matched_string. */
                matched_string = input_symbol + REPEAT_COUNT_REFS
                               + SPECIAL_REFS;
                matched_string_has_already_been_output = FALSE;
            }
        } /* endif this string has already been defined */
    while (--loop_count >= 0); /* end of character processing loop */
    if ( input_length != CHUNK_SIZE )
    {   /* This chunk is shorter than the maximum allowed chunk size.
         * Output the End Of Data reference value to signify the end
         * of the chunk.
         */
        Pack( ref_width, END_OF_DATA_REF_VAL ); /* END OF DATA */
    }
    /* Add Pad */
    PadToNextByte();
    return( PackedLength() / BYTE_SIZE );  /* return byte count */
}
/**************************************************************************/
/**************************************************************************/
/*  END Compress Data using Textual Substitution process.                 */
/**************************************************************************/
/**************************************************************************/
```

```
/* Compute the log base 2 of (the input value + 1), rounded up to the
 * next integer value.  This is the minimum number of bits needed to
 * represent the value passed.  The value 1 is returned if the input
 * value is zero.
 */
static int
Length( data_bits )
     register unsigned int data_bits;
±    register int data_length = 0;
     do
     ±    data_length += 1;
     ²while ( ( data_bits >>= 1 ) != 0 );
     return( data_length );
ż

/******************************************************************************/
/*  FILE: decomp.c                                                           */
/******************************************************************************/ include "compress.h"

/* function defined within this source file */
int decompress();

/* Define compile time flags used in this file: */

/* Define the size of the stack which accumulates the symbols that
     * make up a string.
     */
#define STACK_SIZE 100

/* DICTIONARY_SIZE determines the size of the dictionary which stores
     * strings.  Enough space is reserved for one string to be defined for
     * each decoded character.  In addition, space is reserved for one
     * unused entry for each special reference value, each run specifier
     * reference value and for each reference value which encodes a
     * single character.
     */
#define DICTIONARY_SIZE ( CHUNK_SIZE + REPEAT_COUNT_REFS \
                          + SPECIAL_REFS + (1<<BYTE_SIZE) )

#define FALSE   0
#define TRUE    1

/********************** START OF PROLOGUE ************************
* MODULE TITLE:     Decompress a Chunk of Data
*
* MODULE NAME:      decompress
*
* STATIC FUNCTION DEFINED IN THIS MODULE:
*/
static int Length();
/*
* FUNCTIONAL DESCRIPTION:
* This module restores a chunk of compressed data to its original,
* uncompressed form through an implementation of the reversal of a
* textual substitution compression algorithm.
* Features of the implementation include:
*       1. Run length compression with repeat codes being stored in the
*          dictionary along with characters.
*       2. Single character strings do not occupy space in the
*          string dictionary.
*
* The basic textual substitution algorithm is based on one described
* in the article:  "A Technique for High-Performance Data Compression"
* by Terry A. Welch, Computer, June 1984, pp 8-19.
*
* OPERATIONAL DESCRIPTION:
*   Old_Code = Code = first reference value from compressed data
*   Output the character encoded by the first reference value
*   Save this character in First_Char
*   DO WHILE we aren't done decompressing this chunk
*       In_Code = Code = next reference value from compressed data
*       If the reference value is End Of Data, exit this WHILE loop
```

```
*           If the reference value indicates the presence of a repeat count
*               Decode the repeat count
*               Define a new string consisting of the previously encountered
*                   string (identified by Old_Code) followed by this repeat count
*               Output the number of copies of the most recently output
*                   character specified by the repeat count
*           Else (* the reference value refers to a string *)
*               If the reference value == the reference value of the string
*                   which we will define next, then this is the special case
*                   of the string being referenced being the previously referenced
*                   string (identified by Old_Code) followed by the first character
*                   of the previously referenced string (identified by First_Char)
*                       Push First_Char, which is the last character of the string
*                           identified by the reference value
*                       Code = Old_Code so that the following steps will decode the
*                           string which is the prefix of the referenced string
*               Endif (* special case reference value *)
*               DO WHILE Code is the reference value of a multiple character string
*                   Push the last character of the string identified by Code
*                   Code = the reference value of the string which is the
*                       prefix of the string identified by Code
*               EndWhile
*               (* Code identifies a single character which is the first *)
*               (*   character of the string being decoded. *)
*               First_Char = the character identified by Code
*               Output First_Char
*               Pop values off the stack and output them, replacing repeat
*                   counts with the appropriate number of repetitions of the
*                   previously output character
*               Define a new string consisting of the string identified by
*                   Old_Code followed by the character in First_Char
*               Old_Code = In_Code (* the reference value just input *)
*           Endif (* the reference value identifies a repeat count *)
*       EndWhile (* not done with the chunk yet *)
*       RETURN:  Output buffer containing decompressed data,
*                Length of the data in the output buffer,
*                Amount of compressed data which was decompressed
*
*
* MODULES CALLED:
*/
/* extern void InitUnPack( unsigned char *start_of_input_buffer ) */
    extern void InitUnPack();
/* extern unsigned int UnPack( int field_width ) */
    extern unsigned int UnPack();/* returns the unpacked bit field */
/* extern int BytesUnPacked( unsigned char *start_of_input_buffer ) */
    extern int BytesUnPacked();  /* returns the number of bytes from the */
                                 /*   input buffer which have been unpacked */
/*
*
* INPUT PARAMETERS:
*    unsigned char input_buffer[]  (* data to be decompressed *)
*    unsigned char *input_end      (* pointer to the byte beyond the *)
*                                  (*   end of the data in input_buffer[] *)
*    unsigned char output_buffer[] (* buffer into which the decompressed *)
*                                  (*   data is written *)
*    int *data_consumed            (* pointer to the variable into which *)
*                                  (*   this function writes the number *)
*                                  (*   of compressed bytes which were *)
*                                  (*   consumed from input_buffer[] *)
*
* RETURN VALUE:
*    int (* return code *)         (* number of bytes of decompressed data *)
*                                  (*   stored in output_buffer *)
*
*********************** END OF PROLOGUE  *************************
*/
```

```
/* Define stack operations. */
#define initialize_stack_pointer() stack_pointer = &stack[0]
#define push( val ) *stack_pointer++ = val
#define pop() (*--stack_pointer)
#define stack_not_empty() (stack_pointer > &stack[0])

int
decompress( input_buffer, input_end, data_consumed, output_buffer )
    unsigned char input_buffer[], *input_end, output_buffer[];
    int *data_consumed;
{
    unsigned char
            *bp;       /* pointer to the location in output_buffer where */
                       /*   the next decompressed character is to be put */ int next_ref;      /* reference value to be assigned to the next */
                       /*   string added to the dictionary */ int
            ref_width,  /* number of bits to be input to get the next */
                        /*   reference value */
            ref_limit,  /* when next_ref >= ref_limit, ref_width must */
                        /*   be incremented */
            first_char, /* first character of the string which was most */
                        /*   recently decoded and output */
            incode,     /* reference value just input */
            code,       /* reference value of the string to be looked up */
                        /*   in the dictionary and output.  Usually equal */
                        /*   to incode, but in the case of the reference */
                        /*   value just input being the reference value */
                        /*   of the string to be defined next, code is */
                        /*   loaded with the reference value of the */
                        /*   string that is its prefix. */
            oldcode;    /* reference value input just prior to incode */ int stack[ STACK_SIZE ],   /* the stack in which the characters that */
                               /*   make up a string are assembled */
        *stack_pointer;        /* and the pointer to the head of this stack */
                               /*   (see the push() and pop() macros above) */ static struct
    {   int prefix_string;
        int extension_symbol;
    } String[DICTIONARY_SIZE];  /* dictionary of strings */

InitUnPack( input_buffer );
/******************************************************************/
/******************************************************************/
/* BEGIN Decompress Data using Textual Substitution process.       */
/******************************************************************/
/******************************************************************/
    /* first_string_ref is the first reference value which is beyond all
     * the character reference values and other pre-defined reference values.
     * Thus, it is the first reference value which encodes a string.
     * Initialize next_ref to this value.
     */
#define first_string_ref ( (1 << BYTE_SIZE) + REPEAT_COUNT_REFS + SPECIAL_REFS )
    next_ref = first_string_ref;
    /* Set ref_width to the number of bits needed to allow any reference
     * value from 0 through next_ref - 1 to be uniquely identified.
     * Once the first reference value has been input, it is possible
     * for the next reference value to be any number up to AND INCLUDING
     * next_ref.  Therefore, the width of the remaining fields to be read
     * will be large enough to contain any value from 0 to next_ref.
     *
     * Set ref_limit to the value that, if reached by next_ref, indicates
     * that ref_width must be incremented so that all possible reference
     * values can be represented in ref_width bits.
     */
    ref_width = Length( next_ref - 1 );
    ref_limit = 1 << ref_width;
```

```
        /* The first time through, don't define a string */
        oldcode = -1;
        bp = &output_buffer[0];

do   /* loop until the entire chunk has been decompressed */
        ±
            code = UnPack( ref_width );
            incode = code;  /* remember the reference value just input */ if ( code == END_OF_DATA_REF_VAL ) /* End of Chunk */
                break;

if ( code <= REPEAT_COUNT_REFS )
            ±   register unsigned int c;
/**********************************************************************/
/**********************************************************************/
/*  BEGIN Decode Repeat Counts process.                               */
/**********************************************************************/
/**********************************************************************/
                /* code contains a reference value which preceeds a repeat count */
                code = UnPack( code ) + (1 << code); /* get the repeat count */
/**********************************************************************/
/**********************************************************************/
/*  END Decode Repeat Counts process.                                 */
/*  RESUME Decompress Data using Textual Substitution process.        */
/**********************************************************************/
/**********************************************************************/
                /* When a string is defined below, it will consist of the
                 * previously encountered string followed by this repeat count.
                 */
                incode = next_ref;
                String[next_ref].extension_symbol = -code;
/**********************************************************************/
/**********************************************************************/
/*  BEGIN Replace Repeat Counts with Runs process.                    */
/**********************************************************************/
/**********************************************************************/
                /* Repeat the character most recently output the number
                 * of times specified by the repeat count.
                 */
                c = *(bp-1);         /* c = character to be repeated */
                do
                ±    *bp++ = c;
                ²while ( --code > 0 );
/**********************************************************************/
/**********************************************************************/
/*  END Replace Repeat Counts with Runs process.                      */
/*  RESUME Decompress Data using Textual Substitution process.        */
/**********************************************************************/
/**********************************************************************/
            ²
            else /* code > REPEAT_COUNT_REFS */
            ±
                /* code contains a string reference value.  Decode the string
                 * by stepping through all the strings which are prefixes of
                 * this string, saving in a stack the final character of each
                 * string encountered.
                 */
                initialize_stack_pointer(); /* initialize the stack pointer */
                if ( code == next_ref )
                ±   /* Special case, the string represented by this reference
                     * value is the previously referenced string followed by
                     * the first character of the previously referenced string.
                     * This string won't be put into the dictionary until
                     * after it has been output.
                     */
                    push( first_char );
                    code = oldcode;
                ²
```

```
            while ( code >= first_string_ref )
            ±    /* String reference value:  save the symbol at the end
                  * of the string and get the previous string or character
                  */
                 push( String[code].extension_symbol );
                 code = String[code].prefix_string;
            ²
            /* code now contains the reference value of the first character
             * of the string.  Note that this cannot be a repeat count
             * because it is illegal to define a string which starts with
             * a repeat count.  Output the first character of the string,
             * saving this character in first_char and then output the
             * remainder of the string, which is stored in the stack.
             */
            *bp++ =
            first_char = code - REPEAT_COUNT_REFS - SPECIAL_REFS;
            while ( stack_not_empty() )
            ±    code = pop();
                 if ( code < 0 )
                 ±
/**********************************************************************/
/**********************************************************************/
/*  BEGIN Replace Repeat Counts with Runs process.                    */
/**********************************************************************/
/**********************************************************************/
                 /* This is a repeat count.  Repeat the character most
                  * recently output the specified number of times.
                  */
                 register unsigned int c;
                 c = *(bp-1);        /* c = the character to be repeated */
                 do
                 ±    *bp++ = c;
                 ²while ( ++code < 0 );
/**********************************************************************/
/**********************************************************************/
/*  END Replace Repeat Counts with Runs process.                      */
/*  RESUME Decompress Data using Textual Substitution process.        */
/**********************************************************************/
/**********************************************************************/
                 ²else
                 ±    /* this is a character */
                      *bp++ = code;
                 ²
            ²
            String[next_ref].extension_symbol = first_char;
        ² /* endif input ref value specifies a repeat count */
        if ( oldcode >= 0 )
        ±    /* Define a new string consisting of the previous string
              * followed by the first character of this string.
              */
             String[next_ref++].prefix_string = oldcode;
        ²
        /* A new string has been defined. */
        /* Update ref_width and ref_limit. */
        if ( next_ref >= ref_limit )
        ±    /* There are so many reference values defined that one more
              * bit must be used when outputting a reference value in
              * order to be able to distinguish all the possible values.
              */
             ref_width += 1;
             /* multiply ref_limit by 2 to get next width transtion point */
             ref_limit += ref_limit;
        ²
        oldcode = incode;    /* remember the reference value previously input */
    ² while ( bp < &output_buffer[CHUNK_SIZE] ); /* test for end of input */

/* return amount of compressed data consumed */
    *data_consumed = BytesUnPacked( input_buffer );
    return( bp - &output_buffer[0] ); /* return size of the decompressed data */
/**********************************************************************/
/**********************************************************************/
/*  END Decompress Data using Textual Substitution process.           */
/**********************************************************************/
/**********************************************************************/
²
```

```
/* Compute the log base 2 of (the input value + 1), rounded up to the
 * next integer value.  This is the minimum number of bits needed to
 * represent the value passed.  The value 1 is returned if the input
 * value is zero.
 */
static int
Length( data_bits )
    register unsigned int data_bits;
    register int data_length = 0;
    do
        data_length += 1;
    while ( ( data_bits >>= 1 ) != 0 );
    return( data_length );
```

I claim:

1. A method of compressing an input character stream comprising the steps of:
 replacing a sequential repetition of a single character in said input character stream with said character and a repeat count indicative of the number of sequential repetitions of said character in said input character stream to form a once compressed character stream; and
 encoding said once compressed character stream using textual substitution.

2. The method of claim 1 wherein said step of encoding includes the step of:
 replacing a string, consisting of characters in combination with repeat counts in said once compressed input character stream, that has been previously encountered and entered into a dictionary with a reference value that has been previously assigned to said previously encountered string consisting of characters in combination with repeat counts.

3. The method of claim 2 wherein said step of encoding further includes the step of:
 generating new reference values for strings consisting of characters in combination with repeat counts that have not been previously entered into said dictionary.

4. The method of claim 3 wherein said step of generating includes the step of:
 appending, in response to said not previously encountered string being followed by a character, said following character to said not previously encountered string as part of said reference value definition.

5. The method of claim 1 wherein said repetition of said single input character is greater in number than can be represented by one of said repeat counts, said step of replacing including the step of:
 generating a multiple repeat count representation of said repetition.

6. The method of claim 5 wherein said step of generating includes the step of:
 concatenating a sequence of the largest value ones of said repeat counts, said sequence of repeat counts being the largest such sequence that is less than said repetition of said single character.

7. The method of claim 6 wherein said step of generating further includes the step of:
 appending a repeat count to said sequence of repeat counts, said appended repeat count representative of the difference between said repetition and the value of said sequence.

8. A system for compressing an input character stream comprising:

means for replacing, in response to the presence of a sequential repetition of a single character in said input character stream, said sequential repetition of a single character with said character and a repeat count indicative of the number of sequential repetitions of said character in said input character stream to form a once compressed input character stream;
 means for encoding said once compressed input character stream using textual substitution.

9. The apparatus of claim 8 wherein said encoding means includes:
 means for replacing each string, consisting of characters in combination with repeat counts, in said once compressed input character stream that has been previously encountered with a reference value that had been previously assigned to said previously encountered string.

10. The system of claim 9 wherein encoding means further includes:
 means for generating a new reference value for each string consisting of characters in combination with repeat counts that has not been previously encountered.

11. The system of claim 10 wherein said generating means includes:
 means for appending, in response to said not previously encountered string being followed by a character, said following character to said not previously encountered string as part of said reference value definition.

12. The system of claim 8 wherein said repetition of said single input character is greater in number than can be represented by one of said repeat counts, said replacing means including:
 means for generating a multiple repeat count representation of said repetition.

13. The apparatus system of claim 12 wherein said generating means includes:
 means for concatenating a sequence of the largest value ones of said repeat counts, said sequence being the largest such sequence that is less than said repetition of said single character.

14. The system of claim 13 wherein said generating means further includes:
 means for appending a repeat count to said sequence of repeat counts, said appended repeat count representative of the difference between said repetition and the value of said sequence.

15. A method of compressing an input character stream comprising the steps of:
 substituting the sequential repetition of a single character in said input character stream with said character and a repeat count indicative of the number of sequential repetitions of said character in said input character stream to form a once compressed input character stream;

encoding said once compressed input character stream into reference values representative of strings, consisting of characters in combination with repeat counts, including the steps of:

replacing each string, consisting of characters in combination with repeat counts, that has been previously encountered with a reference value that had been previously assigned to said previously encountered string, generating new reference values for strings, consisting of characters in combination with repeat counts, that have not been previously entered into a dictionary.

16. A method of compressing an input character stream comprising the steps of:

replacing a sequential repetition of a single character in said input character stream with said character and a repeat count indicative of the number of sequential repetitions of said character in said input character stream to form a once compressed input character stream; and compressing said once compressed input character stream using textual substitution.

17. The method of claim 16 wherein said step of compressing includes the step of:

replacing each string, consisting of character in combination with repeat counts, in said once compressed input character stream that have been previously encountered with a reference value that has been previously assigned to said previously encountered string.

18. The method of claim 17 wherein said step of compressing further includes the step of:

generating new reference values for strings, consisting of characters in combination with repeat counts, that have not been previously entered into said dictionary.

19. The method of claim 16 wherein said repetition of said single input character is greater in number than can be represented by one of said repeat counts, said step of replacing including the step of:

generating a multiple repeat count representation of said repetition.

20. The method of claim 19 wherein said step of generating includes the step of:

concatenating a sequence of the largest value ones of said repeat counts, said sequence being the largest such sequence that is less than said repetition of said single character.

21. The method of claim 20 wherein said step of generating further includes the step of:

appending a repeat count to said sequence of repeat counts, said appended repeat count representative of the difference between said repetition and the value of said sequence.

* * * * *